United States Patent
Cheesman et al.

(10) Patent No.: US 6,951,284 B2
(45) Date of Patent: Oct. 4, 2005

(54) WAFER CARRIER WITH WAFER RETAINING SYSTEM

(75) Inventors: Shawn Cheesman, Eden Prairie, MN (US); Shawn D. Eggum, Lonsdale, MN (US)

(73) Assignee: Entegris, Inc., Chaska, MN (US)

( * ) Notice: Subject to any disclaimer, the term of this patent is extended or adjusted under 35 U.S.C. 154(b) by 133 days.

(21) Appl. No.: 10/294,475

(22) Filed: Nov. 14, 2002

(65) Prior Publication Data

US 2003/0132133 A1 Jul. 17, 2003

Related U.S. Application Data

(60) Provisional application No. 60/332,971, filed on Nov. 14, 2001.

(51) Int. Cl.[7] ............................................... B65D 85/48
(52) U.S. Cl. ..................... 206/711; 206/454; 211/41.18
(58) Field of Search ............................... 206/454, 586, 206/710, 711; 211/41.18

(56) References Cited

U.S. PATENT DOCUMENTS

| | | | |
|---|---|---|---|
| 4,043,451 A | | 8/1977 | Johnson |
| 4,248,356 A | | 2/1981 | Johnson |
| 4,555,024 A | | 11/1985 | Voss et al. |
| 4,718,549 A | * | 1/1988 | Rissotti et al. ............... 206/711 |
| 5,207,324 A | * | 5/1993 | Kos ........................... 206/711 |
| 5,253,755 A | | 10/1993 | Maenke |
| 5,273,159 A | | 12/1993 | Gregerson |
| 5,452,795 A | * | 9/1995 | Gallagher et al. .......... 206/711 |
| 5,586,658 A | | 12/1996 | Nyseth |
| 5,711,427 A | | 1/1998 | Nyseth |
| 5,782,362 A | * | 7/1998 | Ohori ......................... 206/711 |
| 5,788,082 A | | 8/1998 | Nyseth |
| 6,082,540 A | | 7/2000 | Krampotich et al. |
| 6,267,245 B1 | * | 7/2001 | Bores et al. ................. 206/711 |
| 6,315,124 B1 | | 11/2001 | Hirohata et al. |
| 6,354,601 B1 | * | 3/2002 | Krampotich et al. ........ 277/628 |
| 6,382,419 B1 | | 5/2002 | Fujimori et al. |
| 6,591,987 B2 | * | 7/2003 | Wu et al. .................... 206/454 |

* cited by examiner

*Primary Examiner*—David T. Fidei
(74) *Attorney, Agent, or Firm*—Patterson, Thuente, Skaar & Christensen, P.A.

(57) ABSTRACT

In a preferred embodiment of the invention, a wafer retaining arrangement is incorporated into a transport module suitable for 300 mm wafers. The wafer retaining arrangement attaches to an interior of a door of the transport module and includes a framework, and a first and a second plurality of wafer engaging members that secure semiconductor wafers within the transport module and that extend laterally from respective first and second sidewall portions and are preferably parallel to one another. Each of the wafer engaging members includes an arm portion and a wafer engagement head spaced laterally from the respective sidewall portion, wherein the wafer engagement heads of the first plurality of wafer engaging members are in close proximity to the wafer engagement heads of the second plurality of wafer engaging members.

24 Claims, 5 Drawing Sheets

WAFER CARRIER WITH WAFER RETAINING SYSTEM

This application claims priority to the Provisional Application Ser. No. 60/332,971 filed on Nov. 14, 2001.

FIELD OF THE INVENTION

This invention relates to carriers for wafers that are processed into semiconductor units. More particularly, the invention relates to wafer retaining arrangements used in sealable enclosures for holding wafers in a horizontal orientation.

BACKGROUND OF THE INVENTION

Semiconductor wafers are subjected to numerous steps during processing in various pieces of processing equipment. The wafers must be transported from workstation to workstation and often must be temporarily stored in order to accommodate the necessary processing steps. Usually such transport and storage is accomplished by putting the wafers into sealed containers to minimize exposure of the wafers to environmental contaminants.

Numerous configurations of carriers have been previously known for handling, storing, and shipping wafers. A common component in carriers configured as closable containers is a molded plastic member known as a cushion to stabilize the positioning of wafers in the container. Such shipping containers with cushions have been previously known as disclosed, for example, in U.S. Pat. Nos. 4,043,451; 4,248,346; 4,555,024; 5,253,755; 5,273,159 and 5,586,658. These types of containers typically include vertical wafer-receiving channels and cushions at the upper and/or lower ends.

These shipping devices have typically been designed to transport wafers or disks in a vertical orientation from place to place, whereas most processing workstations require that wafer processing carriers retain wafers horizontally. Thus, wafers must be reoriented for many processing steps. Where the entire container is reoriented with wafers in place, the wafers can shift and scrape against the wafer pockets, producing particulates.

Corresponding with the increase in the size of wafers being processed into semiconductor chips, the industry is also shifting from vertically oriented containers to containers that maintain the wafers horizontally. Forward wafer restraints for such carriers have comprised a cushion member attached to the door and extending vertically and transverse to the planes of the wafers to engage each wafer along a vertical line. The cushions may be fixed to the inside surface of the door such that they engage the stack of wafers as the door is inserted into the door frame; or, alternatively, the cushions may be attached to mechanisms in the door to extend and retract the cushions independently of the movement of the door into and out of the door frame. For a more detailed discussion, reference is made to U.S. Pat. No. 5,711,427, which is incorporated herein by reference.

With the vertically oriented carrier, wafer receiving channels are designed to hold wafers firmly with a minimum of horizontal movement. With the horizontally oriented carrier, wafer receiving slots are larger than the thickness of wafers to enable wafers to be inserted horizontally into containers and lowered onto a seating position on wafer shelves. To avoid particulate generation, there will ideally be no sliding of the wafer on the wafer shelves. In such carriers, now known as transport modules, contact with the wafers by the carrier is desirably kept to a minimum. Minimal contact with the wafers is believed to create minimal opportunity for particulate generation and particulate contamination of the wafers. In one example, U.S. Pat. No. 5,788,082, which is herein incorporated by reference, discloses shelves and integral beads that provide the minimal contact as being made from specialized abrasion-resistant materials.

Conventional individual resilient fingers for engaging wafers, whether for horizontal or vertically oriented wafers, have a configuration of a V-shape with a bottom wafer-seating portion that is sized to the thickness of the wafer to hold the same securely. Moreover, each wafer is supported at the same circumferential position. That is, the cushions are arranged in a linear row or column. The spacing between horizontal wafers in 300 mm front opening carriers has been standardized by the industry to allow maximum density in the carriers while still allowing insertion room for a robotic arm for insertion and removal. This minimal amount of vertical space makes it extremely difficult to manufacture cushions with vertically aligned wafer engaging fingers and wafer engaging portions that have any allowance for slight vertical misalignments in the wafer engaging portions, such as might be caused by variation in manufacture of the cushions or wafers misaligned on the shelves.

Accordingly, there is a need for a wafer cushion system that provides a forward constraint for sealable wafer enclosures, inhibits wafer movement while in the wafer carrier so as to prevent flutter, compensates for manufacturing variations and provides for wafer-cushion engagement portion misalignments.

SUMMARY OF THE INVENTION

In a preferred embodiment of the invention, a wafer retaining arrangement is incorporated into a transport module suitable for 300 mm wafers. The wafer retaining arrangement attaches to an interior of a door of the transport module and includes a rectilinear framework having a top and a bottom portion configured as rails integral with first and a second sidewall portion, also configured as rails, the first and second sidewall rails having a length that extends from the top portion to the bottom portion of the framework. The wafer retaining arrangement also includes a first and a second rows of wafer engaging members that secure the front edges of the semiconductor wafers within the transport module. The wafer engagement members that extend inwardly from, and are perpendicular to, first and second sidewall portions or rails of the wafer retainer framework. The first row of wafer engaging members parallel to and aligned with the second row of wafer engaging members disposed along the length of the second sidewall rail, each of the wafer engaging members including an arm portion or linear arm and a wafer engagement head spaced laterally from the respective sidewall portion. The wafer engagement heads of the first plurality of wafer engaging members are disposed in close proximity to the wafer engagement heads of the second plurality of wafer engaging members, ideally within 1 centimeter, and apply a force on the disk as a function of the deflection of the arm. The wafer engagement heads have a squared U-shape in the cross section that provides a wafer edge receiving surface shaped as a square sawtooth. Each head has a flat vertical landing and upper and lower horizontal flanges or constraints.

The first and second sidewall rails of the framework of the wafer retaining arrangement include a plurality of apertures and a base flange that facilitate a snap-on attachment of the wafer retaining arrangement to the interior of the transport module door.

It is an object of particular embodiments of the invention to provide forward constraint of wafers in a front-opening wafer enclosure with minimal wafer contact by the wafer retaining arrangement and with the wafer contact very close to the vertical centerline of the wafer container. Furthermore, it is a object and advantage of particular embodiments to provide the wafer engagement arms that are substantially parallel to the front door or normal to the direction of insertion and removal of wafers. This allows the wafer engagement members to deflect in a near radial direction with a substantially pure bending moment with no compressive loading of the wafer engaging arm.

It is an object of particular embodiments of the present invention to provide a wafer carrier with a wafer retaining arrangement steadfastly secured to the interior of the wafer container door to provide precise control of the engagement of the wafers.

Another object and advantage of particular embodiments of the invention is to provide minimal contact with the wafer to reduce contamination of wafers during transport and storage. Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

It is understood that the above figures are for illustrative purposes only and are not meant to limit the scope of the claimed invention.

DETAILED DESCRIPTION OF THE PREFERRED EMBODIMENT

Figure 1:
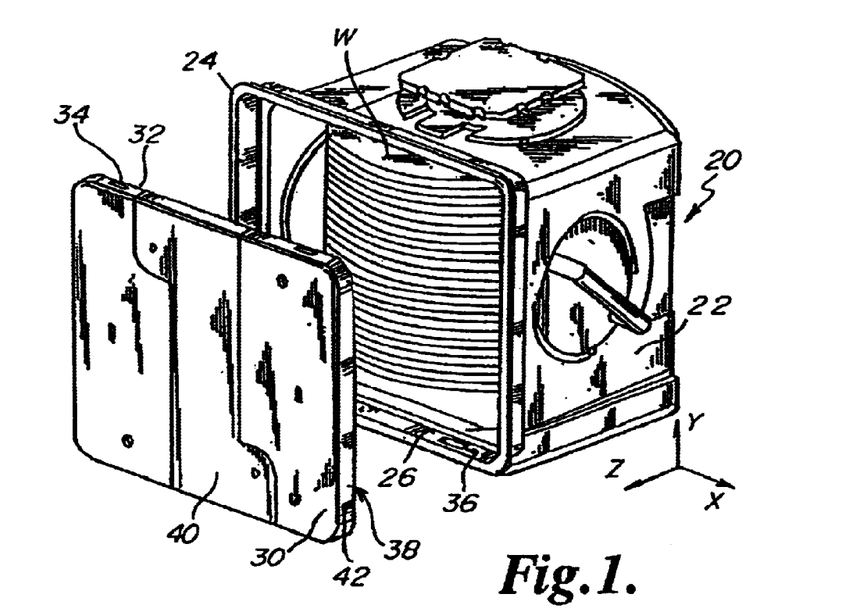
FIG. 1 shows a perspective view of a wafer carrier for holding wafers in a horizontal orientation suitable for incorporating the present invention.

FIG. 1 illustrates a prior art front opening transport module 20 that is appropriate for use with or as part of the instant invention. "Transport module" is a generic term for a semiconductor wafer or reticle enclosure used for transporting, storing and/or shipping wafers and reticles. In this example, transport module 20 is generally comprised of an enclosure portion 22 with a door frame 24 defining a front opening 26 for insertion and removal of wafers (W). An enclosure door 30 is configured to sealingly enclose front opening 26 and includes a seal 32 and a latch mechanism 34 to engage with latch receivers 36 on enclosure portion 22. The door generally comprises an inside or interior wall 38 and an exterior wall 40. The interior and exterior walls define an interior space 42 that houses latching mechanism 34.

Figure 2:
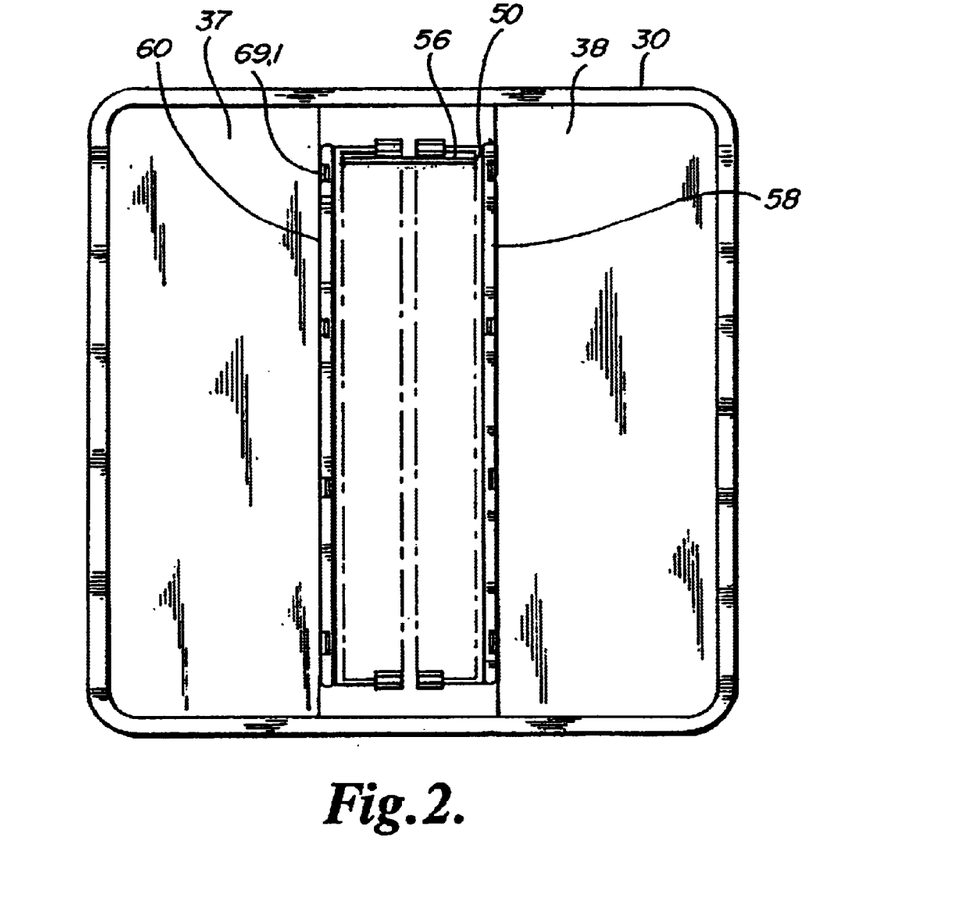
FIG. 2 is a front elevational view of an inside portion of the door illustrated in FIG. 1 incorporating a wafer retaining arrangement according to an example embodiment of the present invention.
Figure 3:
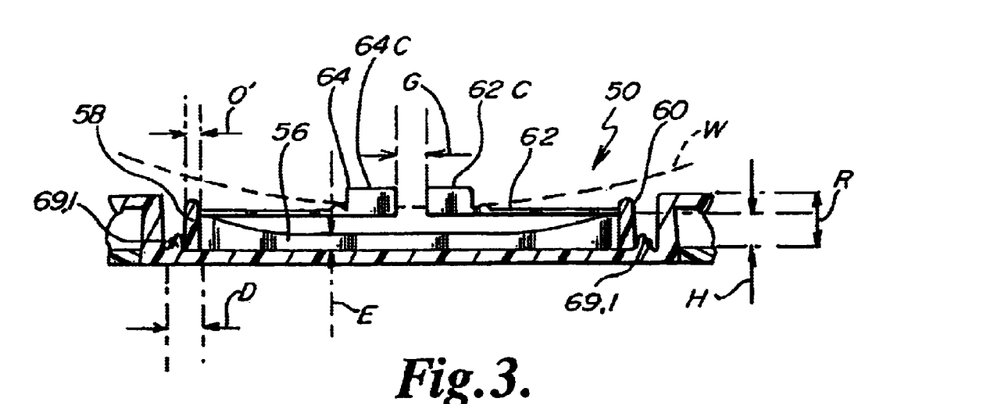
FIG. 3 is a cross sectional view of the wafer retaining arrangement located in the door illustrated in FIG. 2 according to an example embodiment of the present invention.

FIGS. 2 and 3 are elevation and cross section plan views, respectively, of an inside wall 38 of the door illustrated in FIG. 1 incorporating a wafer retaining arrangement 50 according to an example embodiment of the present invention. In this example embodiment, wafer retaining arrangement 50 is located within door 30 and is recessed with respect to an upper surface of inside wall 38. Such an approach facilitates the production of a slimmer door for module 20, which reduces the overall size, weight and amount of material necessary to manufacture module 20. The construction of an example embodiment of the wafer retaining arrangement is described in connection with FIGS. 4–7.

Figure 4:
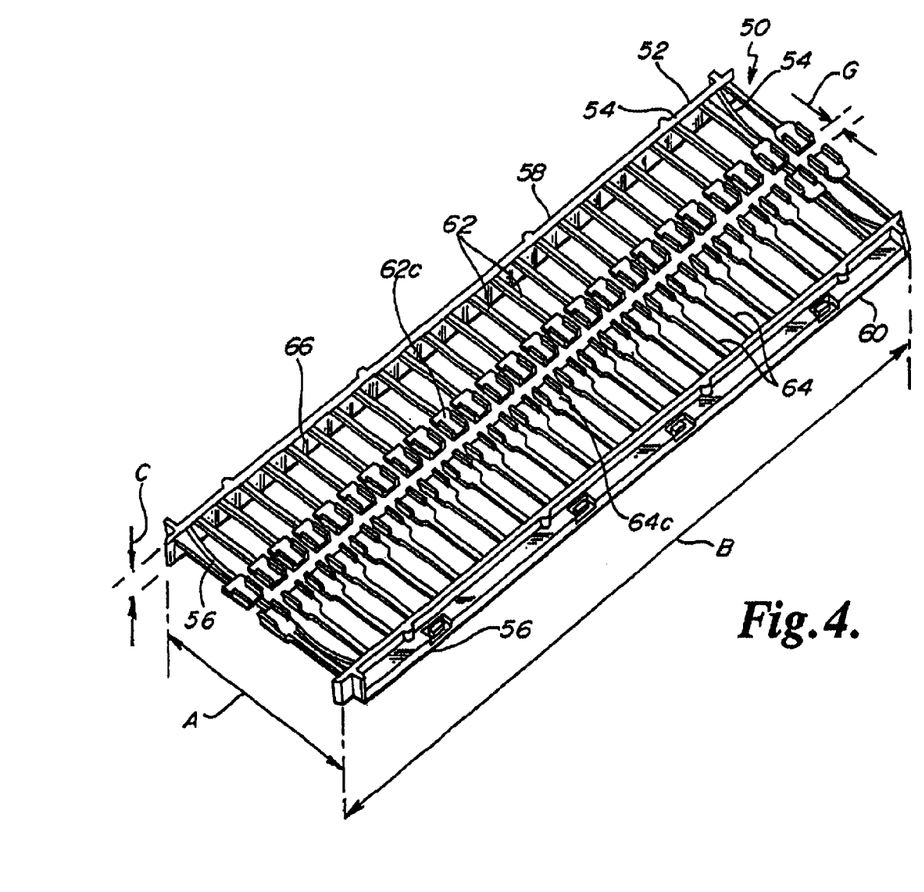
FIG. 4 is another perspective view of the wafer retaining arrangement according to an example embodiment of the present invention.

FIG. 4 illustrates a wafer retaining arrangement 50 that generally comprises a frame 52 formed from a top portion 54 and a bottom portion 56 that connect a first sidewall portion or left vertical sidewall rail 58 and a second sidewall portion or right vertical sidewall rail 60. First and second sidewall portions 58 and 60 have a length that may extend from top portion 54 to bottom portion 56 of frame 52. In this example embodiment, FIG. 4 illustrates top and bottom portions 54 and 56 being recessed about 7–9 mm (e.g., 10.38 mm) from the length of sidewall portions 58 and 60. Frame 52 has a width A of about 88 mm, a length B of about 248 mm and a height C of about 13 mm.

Figure 5:
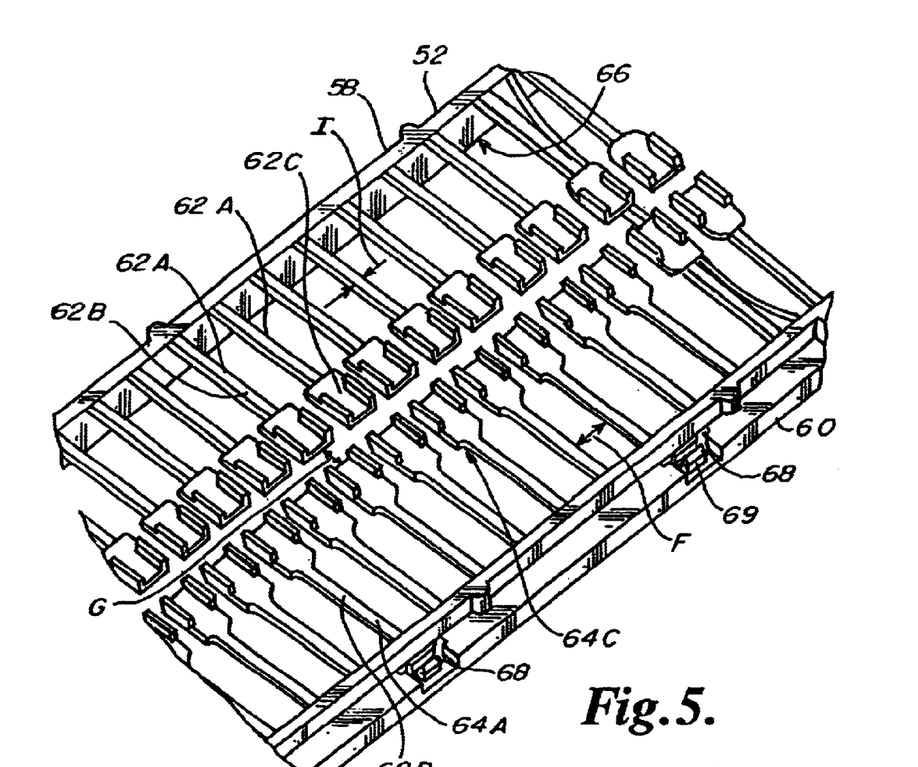
FIG. 5 is an enlarged perspective view of the wafer engagement members according to an example embodiment of the present invention.

Referring to FIGS. 3 and 5, sidewall portions 58 and 60 have a width D of about 6 mm and an upper thickness D' of about 3 mm. Top and bottom portions 54 and 56 have a thickness E of about 2 mm. Wafer retaining arrangement 50 also includes a first and a second plurality of wafer engaging members 62 and 64, respectively, that extend laterally from an inner surface 66 of the respective first and second sidewall portions. Wafer engaging members 62 and 64 secure the plurality of semiconductor wafers within the transport module. In this example, there are about 25 wafer engaging members 62 and 64, respectively. The first plurality of wafer engaging members 62 is disposed along the length of first sidewall portion 58 and the second plurality of wafer engaging members 64 is disposed along the length of the second sidewall portion 60. In this example embodiment, the top and bottom portions of frame 52 are curved to facilitate flexure in a cantileving manner of the wafer engaging members. In addition, top and bottom portions 54 and 56 have an arcuate structure such that the heights of portions 54 and 56 decrease as they approach the center of the frame (FIG. 5A and FIG. 8). A concave section (54") of the top and bottom portions is disposed beneath the wafer engaging members to ensure the flexure of wafer engaging members 62 and 64 is unobstructed (e.g., from 54' to 54"; FIG. 5A). The center-to-center distance, indicated as F, between each of the adjacent wafer engaging members (e.g., members 64) is about 10 mm.

As illustrated further in FIGS. 3 and 5, each of the wafer engaging members, such as 62A and 64A, includes an arm portion 62B and a wafer engagement head 62C disposed laterally from sidewall portion 58. In this example embodiment, arm portion 62B is configured as a long rectangular body that provides a desired degree of flexure. Although a rounded body (e.g., pole-type or rounded) is operable, the degree of flexure is greater and harder to control. In addition, the equilibrium point of the arm portion is substantially perpendicular to inner surface 66. Such an approach simplifies the overall molding of wafer retaining arrangement 50 since it is not necessary to form the arm portion to protrude up or down, at a predetermined angle, as in other known wafer cushion designs. The absence of an acute angle of the arm portion also reduces the likelihood of manufacturing variability from lot to lot of wafer retaining arrangement 50. In this example embodiment, the width of arm portion 62B is 3.3 mm and the thickness is about 1.8 mm. The ratio of width to thickness of the arm portion is about 1.84 to 1, which gives the arm portion the desired flexure. Using the rectangular cantilever configuration in the arm portion, as opposed to the rounded/pole-type configuration, raises the resonant frequency, making it more difficult for the wafer engaging members to move as the transport module is moved within the semiconductor processing facility.

Configuring the arm portion of the wafer engaging member without an angle also provides a pure bending load on the cantilever arm of the arm portion and not a partial tensile or compressive load as would be experienced in a cantilever arm having an acute angle with respect to the sidewall member (e.g., sidewall 60). Deflection (δ) of the arm portion of wafer engaging members 62 and 64 is also a function of the modulus of elasticity (E):

$$\delta = (WL^3)/(3EI)$$

where W represents the load on the cantilever arm, L represents the distance from the fixed cantilever point to the load and I represents the moment of inertia of the cantilever arm cross section. In this example, the material composition of the arm portion of is 80% PEEK and 20% MCF (metal carbon fibers). For PEEK, E=8.565 Gpa (gigapascals) and for MCF, E=3.226 Gpa. The amount of deflection in the arm portion, the design of the wafer engagement head and the proximity of the opposing wafer engagement heads cooperatively operate to secure the semiconductor wafers within the transport module and substantially reduce the incidence of particulate generation.

Figure 7:
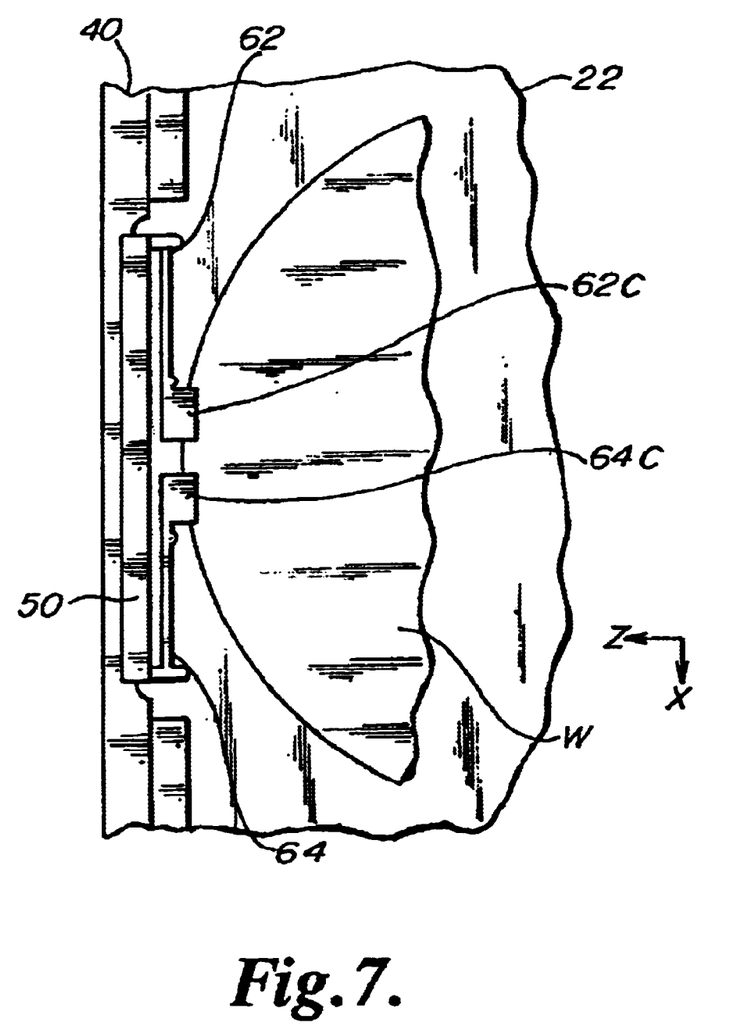
FIG. 7 is a top view of a portion of the wafer carrier of FIG. 1 illustrating a set of wafer engagement members retaining a wafer in the wafer carrier according to an example embodiment of the present invention.

Referring to FIGS. 3, 5, and 7, wafer engagement heads 62C of wafer engaging members 62 are in close proximity to wafer engagement heads 64C of wafer engaging members 64 (e.g., generally within two inches). In this example embodiment, the distance between wafer engagement heads 62C and 64C, indicated as G, is preferably about 5 mm and in preferred embodiments may be less than 1 centimeter or in some cases less than 2 centimeters and still retain many of the functional advantages. The two rows of wafer heads are centered at the centerline $C_L$ of the wafer container and door. The close proximity of corresponding wafer engagement heads 62C and 64C substantially function as a single point of force that pushes wafer W against the (backstops) rear of housing 22, thereby supporting and stabilizing the wafer on three major points within the transport module. The two backstops and the wafer engagement heads provide a more efficient application of force on the wafer in retaining the wafer within the transport module. An increased distance or separation between corresponding wafer engagement heads lowers the resonant frequency which increases the likelihood of wafer movement. In addition, increased separation between corresponding wafer engagement heads creates another point of force on the wafer (four points instead of three) that can later be a point of instability. Wafer instability can later manifest itself as the engagement heads fail to provide an equal force on the wafer as a result of flexure fatigue through continuous use. The close proximity of the aligned wafer engagement heads is less than or equal to a spacing between the wafer engagement heads that permits a circumferential surface of the wafer to protrude beyond a plane formed by the elongated bodies corresponding to the aligned wafer engagement heads.

Referring further to FIGS. 3 and 5, the distance between the wafer engaging members and the bottom of the sidewall portions, indicated as H, is about 10 mm; while the width of the wafer engaging members, indicated as I, is about 3.3 mm. Frame 50 provides a solid sidewall design that includes mounting apertures and flanges, for example mounting aperture 68 and flange 69, that engage with posts 69.1 on the enclosure door interior surface to facilitate snap-on mounting (see FIG. 5B).

Figure 6A:
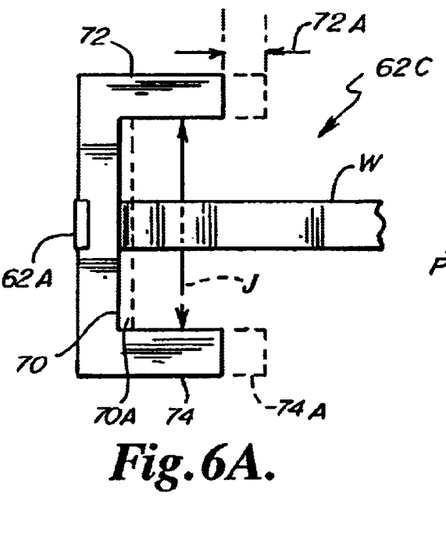
FIG. 6A is a cross-sectional view of a wafer engaged by an example configuration of a wafer engagement head portion of the wafer retaining arrangement according to an example embodiment of the present invention.

Referring to FIGS. 5 and 6A, in this example embodiment, wafer engagement heads 62C and 64C are comprised of a square tooth profile that secures the semiconductor wafer. The square tooth profile includes a middle base portion 70 that is parallel to arm portion 62B. The square tooth profile of wafer engagement head 62C also includes an upper flange 72 and a lower flange 74 that are parallel to each other and extend perpendicularly up from middle base portion 70. Arm portion 62C of wafer engaging member 62 has a width, indicated as I (where I is about 3.3 mm), that extends parallel to the length of sidewall portion 58. Middle base portion 70 has a width, indicated as J (where J is about 4.6 mm), which is parallel to the width of arm portion 62B and is about 5 mm in dimension. In this example embodiment, the width of arm portion 62B is less than the width of middle base portion 70.

Arm portion 62B and wafer engagement head 62C can deflect back as wafer engagement head 62C makes contact with the semiconductor wafer (W). As illustrated in FIG. 6A, engagement head 62C deflects back from positions 70A, 72A and 74A as head 62C makes contact with wafer (W). In addition, the square tooth profile of head 62C firmly secures the wafer between flanges 72 and 74 to inhibit wafer movement and overcome problems of flutter. Flanges 72 and 74 are configured to be sufficiently long to prevent wafers from "walking" or popping loose. The extended width (or depth) of middle base portion 70 of the wafer engagement head also allows for variations in the positioning of the wafer engagement head that might occur during molding or due to excessive wear. Additionally, the extended width of flange 70 compensates for slight misalignment of the door.

In a related embodiment, wafer engagement heads 62C and 64C can be formed of a v-shaped groove and are not necessarily limited to the profile disclosed and described herein.

Figure 6B:
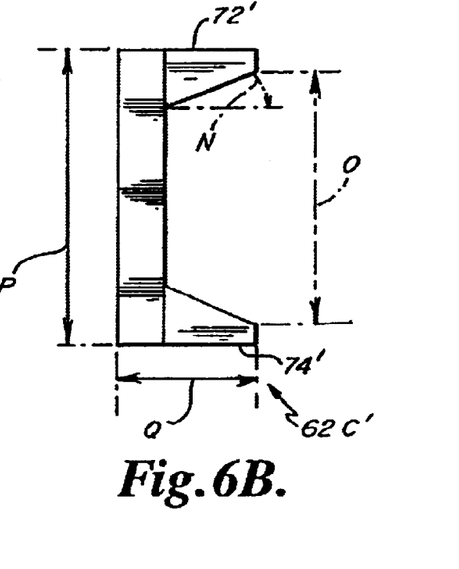
FIG. 6B is a cross-sectional view of a wafer engaged by another example configuration of a wafer engagement head portion of the wafer retaining arrangement according to an example embodiment of the present invention.

FIG. 6B is a cross-sectional view of a wafer engaged by another example configuration of a wafer engagement head portion of the wafer retaining arrangement according to an example embodiment of the present invention. In this example embodiment, a concave profile of head 62C' includes triangular portions 72' and 74' that not only facilitate the insertion of the wafer into the engagement head but also prevent the wafer from "walking" when the transport module is moved. The inside width O of head 62C' is about 4.6 mm, the outside width P is about 5.4 mm, and the height Q is about 4.5 mm. Portions 72' and 74' are inclined at an angle of N degrees, where N is preferably less than or equal to 30 degrees. Where angle N exceeds 30 degrees, the likelihood increases for the wafer to "walk" out of the engagement head.

The length (Q) of triangular portions 72' and 74' also assist in retaining wafer W within engagement head 62C'. In this example embodiment, the ratio of Q/P is about 0.83 to 1. The retention improves as the Q/P ratio approaches 1:1.

FIG. 7 is a top view of a portion of the wafer carrier of FIG. 1 illustrating a set of wafer engagement members retaining a wafer in the wafer carrier according to an example embodiment of the present invention. In this example embodiment, wafer retaining arrangement 50 retains the wafer (W) in its position via wafer engaging members 62 and 64. More specifically, wafer engagement heads 62C and 64C engage the wafer at the wafer's edge to prevent forward movement (in the Z direction) that can lead to problems of flutter. However, where necessary, wafer (W) is movable in an axial direction. In this example, the wafer engagement heads 62C and 64C are formed of a concave or square tooth profile, which provides consistent and symmetrical wafer contact and a low-force deflection for enclosure door closure. For a more detailed description of the mounting of a semiconductor wafer in a transport module, reference is made to U.S. Pat. No. 6,082,540 to Krampotich et al., and U.S. Pat. No. 6,267,245 to Bores et al., which are herein incorporated by reference.

Due to the significant value of the wafers contained by the front opening wafer containers, particularly 300 mm or larger, precise control and consistency in wafer retention by the front door is very important. Such precise control is facilitated by providing isolation to the flexure of each wafer-engaging member.

Conventional wafer restraints may utilize a framework comprised of two columns of wafer engagement heads and elongated bodies. The framework is conventionally secured to the inside surface of the door by various means such as deflecting the framework laterally inward and inserting into receiving slots positioned in the inside door central recess. Such conventional wafer retaining arrangements have poor individual wafer engaging member isolation. Part of a deflection force of a single wafer-engaging member can be transferred to the framework and can cause movement of wafer engaging members in close proximity to the single member (or the entire column of engaging members). The inability to isolate the movement of individual wafer engaging members conflicts with the need for precise control and retention of the wafers within the wafer container.

Conversely to the prior art, the present invention provides for maximum lateral flexure of each set of the wafer engaging members without transferring any force or movement to an adjacent set of wafer engaging members or to frame 52. In one example embodiment, flexure of wafer engaging member 62A is about 10 degrees from the non-flexed position (see 70A, 72A and 74A; FIG. 6A). In addition, wafer-retaining arrangement 50 maintains spacing between wafers, between the top surface of one wafer and the bottom surface of another wafer, a distance of about 11 mm.

Conventional wafer container doors will have an inside facing surface and a centrally positioned inside door recess. FIG. 3 is a side view of the inside portion of door 40 and the wafer retaining arrangement according to an example embodiment of the present invention. The recess, indicated as R, may have a depth of about 21 mm. This configuration provides an advantage of the wafer engaging members applying less force on each individually mounted wafer within the wafer container upon affixing door 40 to housing 22. The wafers are still retained within the wafer container without applying a possible detrimental force upon closure.

The various embodiments described provide: a hard stop touch on wafer retaining arrangement for wafer push back, a wafer engagement head that wraps the wafer to prevent misalignment or cross-slotting of wafers and wafer engagement head profiles that inhibit or eliminate wafer creep. In a related embodiment, the retaining arrangement can be used to retain disks such as reticles or other disks that are moved in a carrier in multiple quantities.

In one example embodiment, wafer retaining arrangement 50 may be molded principally of polyetheretherketone (PEEK). Polytetrafluoroethyelene (PTFE) may be added in small quantities, for example, 5%. PEEK provides a fairly stiff and resilient wafer retaining arrangement. One example of the quantity of deflection of the wafer engagement members is about 0.040 inches from an undeflected position. In addition, PEEK aids in reducing particulate matter from developing within transport module 20 during shipping.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

What is claimed is:

1. A front opening wafer container for holding a plurality of wafers in a horizontal vertically stacked and spaced arrangement, the container comprising an enclosure portion with an open front and a door to close the open front, the door comprising a wafer cushion extending vertically on an inside surface of the door for engaging the wafers when the door is in place on the enclosure portion, the wafer cushion comprising a rigid rectilinear framework with a pair of horizontal endwall rails, a left vertical sidewall rail, and a right vertical sidewall rail, a first vertical row of wafer engaging members extending inwardly from the left sidewall rail and a second vertical row of wafer engaging members extending inwardly from the right sidewall rail, each wafer engaging member having an arm portion and a wafer engagement head, the arm portion presenting a longitudinal axis and extending substantially linearly from the respective rail when not deflected, wherein the wafer engagement heads of the row of wafer engagement members extending from the left vertical sidewall rail are positioned in close proximity to the wafer engagement heads of the row of wafer engagement members extending from the right vertical sidewall rail and the longitudinal axis of each arm portion of the row of wafer engagement members extending from the left vertical sidewall rail is substantially coaxial with the longitudinal axis of the arm portion of a separate one of the wafer engagement members in the row of wafer engagement members extending from the right vertical sidewall rail when the wafer engagement members are not deflected.

2. The front opening wafer container of claim 1 wherein the wafer engagement heads of the row of wafer engagement members extending from the left vertical sidewall rail are within 1 centimeter of the wafer engagement heads of the row of wafer engagement members extending from the right vertical sidewall rail.

3. The front opening wafer container of claim 1 wherein the wafer engagement heads of the row of wafer engagement members extending from the left vertical sidewall rail are about 5 mm from the wafer engagement heads of the row of wafer engagement members extending from the right vertical sidewall rail.

4. The front opening wafer container of claim 1 wherein each wafer engagement head has a wafer engagement surface with a square sawtooth shape.

5. The front opening wafer container of claim 4 wherein each wafer engagement head has a vertical flat for receiving the edge of the wafer, and wherein the height of said flat is at least two times the thickness of the wafer to be received.

6. The front opening wafer container of claim 1 wherein the wafer cushion is integrally formed and is comprised of poly ether ether ketone.

7. The front opening wafer container of claim 1 wherein the wafer cushion is positioned in a recess in the inside surface of the door and the framework attaches onto posts extending from the door.

8. A front opening wafer container for holding a plurality of wafers in a horizontal vertically stacked and spaced arrangement, the container comprising an enclosure portion with an open front and a door to close the open front, the door comprising a wafer cushion extending vertically on an inside surface of the door for engaging the wafers when the door is in place on the enclosure portion, the wafer cushion comprising a rigid framework with a left vertical sidewall rail, and a right vertical sidewall rail, a first vertical row of wafer engaging members extending inwardly from the left sidewall rail and a second vertical row of wafer engaging members extending inwardly from the right sidewall rail, each wafer engaging member having an arm portion extending from the respective rail and a wafer engagement head, the arm portion of each wafer engaging member presenting a longitudinal axis, wherein the wafer engagement heads of the row of wafer engagement members extending from the left vertical sidewall rail are positioned within one centimeter of the wafer engagement heads of the row of wafer engagement members extending from the right vertical sidewall rail, and the longitudinal axis of each arm portion in the row of wafer engagement members extending from the left vertical sidewall rail is substantially coaxial with the longitudinal axis of the arm portion of a separate one of the wafer engagement members in the row of wafer engagement members extending from the right vertical sidewall rail.

9. The front opening wafer container of claim 8 wherein the arm portions of the row of wafer engagement members extending from the left vertical sidewall rail are parallel to the arm portions of the row of wafer engagement members extending from the right vertical sidewall rail when the wafer engagement members are not deflected.

10. A front opening wafer container for holding a plurality of 300 mm wafers in a horizontal vertically stacked and spaced arrangement, the container comprising an enclosure portion with an open front and a door to close the open front, the door comprising a wafer cushion extending vertically on an inside surface of the door for engaging the wafers when the door is in place on the enclosure portion, the wafer cushion comprising a rigid framework with a left vertical sidewall rail, and a right vertical sidewall rail, a first vertical row of wafer engaging members extending inwardly from the left sidewall rail and a second vertical row of wafer engaging members extending inwardly from the right sidewall rail, each wafer engaging member having an arm portion extending from the respective rail and a wafer engagement head, the arm portion of each wafer engaging member presenting a longitudinal axis, wherein the longitudinal axis of each arm portion in the row of wafer engagement members extending from the left vertical sidewall rail is substantially coaxial with the longitudinal axis of the arm portion of a separate one of the wafer engagement members in the row of wafer engagement members extending from the right vertical sidewall rail when the wafer engagement members are not deflected.

11. The front opening wafer container of claim 10 wherein the wafer engagement heads of the row of wafer engagement members extending from the left vertical sidewall rail are within 1 centimeter of the wafer engagement heads of the row of wafer engagement members extending from the right vertical sidewall rail.

12. The front opening wafer container of claim 10 wherein each wafer engagement head has a wafer engagement surface with a square sawtooth shape.

13. A disk retaining arrangement for use in an apparatus for transporting and storing semiconductor disks, the disk retaining arrangement comprising:
  a frame having a top and a bottom portion adapted to connect a first and a second sidewall portion, the first and second sidewall portions having a length that extends from the top portion to the bottom portion of the frame; and
  a first and second plurality of disk engaging members adapted to secure a semiconductor disk within a disk transport apparatus, the disk engaging members extending laterally from and being substantially perpendicular to an inner surface of the respective first and second sidewall portions, the first plurality of disk engaging members parallel to and opposingly aligned with the second plurality of disk engaging members, each of the disk engaging members including an arm portion and a disk engagement head spaced laterally from the respective sidewall portion, each disk engaging member presenting a longitudinal axis, the longitudinal axis of each disk engaging member in the first plurality of disk engaging members substantially coaxially aligned with the longitudinal axis of a separate one of the disk engaging members in the second plurality of disk engaging members when the disk engaging members are not deflected, the disk engagement heads of the first plurality of disk engaging members disposed in close proximity to the disk engagement heads of the second plurality of disk engaging members, wherein a force is applied on the disk from the frame as a function of the close proximity of the aligned disk engagement heads of the first and second plurality of disk engaging members, wherein the disk engagement head is comprised of a concave profile adapted to secure the semiconductor disk, the concave profile including a middle base portion bounded by side flanges, and wherein the middle base portion is vertical and the side flanges extend substantially perpendicular to the middle base portion.

14. The disk retaining arrangement of claim 13, wherein the disk engagement head is comprised of square tooth profile adapted to secure the semiconductor disk, the square tooth profile including a middle base portion bounded by side flanges, the middle base portion having a surface that is parallel to a surface of the arm portions and side flanges adapted to extend perpendicularly from the middle base portion.

15. The disk retaining arrangement of claim 13, wherein the frame further comprises a plurality of apertures and a mounting flange disposed on each of the vertical sidewall rails, the apertures sized for posts extending horizontally from a door wherein the framework is secured to the door of the disk transport apparatus.

16. The disk retaining arrangement of claim 13 wherein the disk engaging members are adapted to be disposed below an interior surface of a door when the disk retaining arrangement is mounted on the door.

17. The disk retaining arrangement of claim 13, wherein each of the disk engaging members are adapted to flex without causing movement to an adjacent disk engaging member.

18. A wafer carrier for transporting a plurality of wafers in a semiconductor facility, the wafer carrier comprising:

a housing having an opening for insertion and removal of the wafers;

a door for closing the opening of the housing having an inwardly facing surface; and a wafer retaining arrangement comprised of:

a frame having a top and a bottom portion adapted to connect a first and a second sidewall portion, the first and second sidewall portions having a length that extends from the top portion to the a first and second plurality of wafer engaging members adapted to secure a semiconductor disk within the wafer carrier, the wafer engaging members extending laterally from and being perpendicular to an inner surface of the respective first and second sidewall portions, each of the wafer engaging members presenting a longitudinal axis, the longitudinal axis of each wafer engaging member in the first plurality of wafer engaging members substantially aligned with the longitudinal axis of a separate one of the wafer engaging members in the second plurality of wafer engaging members when the wafer engaging members are not deflected, each of the wafer engaging members including an arm portion and a wafer engagement head spaced laterally from the respective sidewall portion, the wafer engagement heads of the first plurality of wafer engaging members disposed in close proximity to the wafer engagement heads of the second plurality of wafer engaging members.

19. The wafer carrier of claim 18, wherein the wafer engagement head is comprised of a concave profile adapted to secure the semiconductor wafer, the concave profile including a middle base portion bounded by side flanges, wherein the middle base portion has a plane that is perpendicular to the respective sidewall portion and the side flanges are adapted to extend substantially perpendicular to the middle base portion.

20. The wafer carrier of claim 19, wherein the arm portion of each of the wafer engaging members has a width that extends along a length of the respective sidewalls and the middle base portion has a width that is parallel to the width of the arm portion, the arm portion adapted to facilitate deflection as the width of the arm portion is less than the width of the middle base portion.

21. The wafer carrier of claim 18, wherein the frame further comprises at least one mounting aperture and a mounting flange disposed on at least one sidewall portion adapted to secure the frame to the door of the wafer carrier.

22. The wafer carrier of claim 21, wherein the wafer engaging members are adapted to be disposed below an interior surface of the door when the wafer retaining arrangement is mounted on the door.

23. A front opening wafer container for holding a plurality of 300 mm wafers in a horizontal vertically stacked and spaced arrangement, the container comprising an enclosure portion with an open front and a door to close the open front, the door comprising a wafer cushion extending vertically on an inside surface of the door for engaging the wafers when the door is in place on the enclosure portion, the wafer cushion comprising a rigid framework with a left vertical sidewall rail, and a right vertical sidewall rail, a first vertical row of wafer engaging members extending inwardly from the left sidewall rail and a second vertical row of wafer engaging members extending inwardly from the right sidewall rail, each wafer engaging member having an arm portion extending from the respective rail and a wafer engagement head, each of the wafer engaging members presenting a longitudinal axis, the longitudinal axis of each wafer engaging member in the first vertical row of wafer engaging members substantially aligned with the longitudinal axis of a separate one of the wafer engaging members in the second vertical row of wafer engaging members when the wafer engaging members are not deflected, wherein each wafer engagement head has a vertical flat for receiving the edge of the wafer intermediate horizontal side flanges, and wherein the height of said flat is at least two times the thickness of the wafer to be received and wherein the side flanges are substantially perpendicular to the vertical flat.

24. The front opening wafer container of claim 23 wherein the wafer engagement heads of the row of wafer engagement members extending from the left vertical sidewall rail are about 5 mm from the wafer engagement heads of the row of wafer engagement members extending from the right vertical sidewall rail.

* * * * *